(12) United States Patent
Brokaw

(10) Patent No.: US 6,822,512 B2
(45) Date of Patent: Nov. 23, 2004

(54) HIGH GAIN AMPLIFIER WITH RAIL TO RAIL RANGE AND FREQUENCY COMPENSATION

(75) Inventor: Adrian Paul Brokaw, Tucson, AZ (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/378,704

(22) Filed: Mar. 4, 2003

(65) Prior Publication Data

US 2003/0218503 A1 Nov. 27, 2003

Related U.S. Application Data

(63) Continuation of application No. 09/642,432, filed on Aug. 21, 2000, now Pat. No. 6,563,384.

(51) Int. Cl.[7] .................................................. H03F 3/45
(52) U.S. Cl. ........................ 330/252; 330/257; 330/292
(58) Field of Search ................................. 330/252, 257, 330/260, 261, 292, 301

(56) References Cited

U.S. PATENT DOCUMENTS 4,857,862 A 8/1989 Brokaw 6,104,244 A 8/2000 Gilbert
6,366,165 B1 * 4/2002 Huijsing et al. ............ 330/252

OTHER PUBLICATIONS

Senturia, Stephen and Wedlock, Bruce, Electronic Circuits and Applications, Krieger Publishing Company, Malabar, Florida, 1993, pp. 256 & 264.*

* cited by examiner

*Primary Examiner*—Steven J. Mottola
(74) *Attorney, Agent, or Firm*—Iandiorio & Teska

(57) ABSTRACT

A high gain amplifier includes a differential amplifier stage having a pair of transistors; first and second input circuits for providing input signals to the pair of transistors; transistor means arranged as a differential-to-single-ended converter driven by the differential amplifier stage to provide a single ended output signal; an intermediate gain stage having an input responsive to the single ended output signal; bias means for the differential amplifier, the bias means including circuit means for maintaining the currents through the pair of transistors in constant ratio independently of changes in load at the intermediate gain stage; and an inverting gain output stage driven by the intermediate gain stage and having an output for driving a load substantially from rail to rail. Also disclosed is a frequency compensation capacitor circuit connected between the input of the intermediate gain stage and the output of the inverting gain output stage.

24 Claims, 4 Drawing Sheets

HIGH GAIN AMPLIFIER WITH RAIL TO RAIL RANGE AND FREQUENCY COMPENSATION

RELATED APPLICATIONS

This application is a continuation of, and claims priority to, U.S. patent application Ser. No. 09/642,432 filed on Aug. 21, 2000 now U.S. Pat. No. 6,563,384 entitled "HIGH GAIN AMPLIFIER WITH RAIL TO RAIL RANGE FREQUENCY COMPENSATION".

FIELD OF THE INVENTION

This invention relates to a high gain amplifier which drives a load substantially from rail to rail and to a frequency compensator circuit for this and other amplifiers.

BACKGROUND OF THE INVENTION

In certain types of high gain amplifiers such as disclosed in U.S. Pat. No. 4,857,862 (incorporated by reference herein in its entirety) by the same inventor it is not possible to drive the output from rail to rail. The phrase "rail to rail" as used herein generally means that the voltage is able to swing between the negative power supply and positive power supply. However, it being understood that this is an approximation as the signal does not swing completely to the negative and positive supply voltages but rather can only closely approach them. These amplifiers typically have a differential amplifier input stage including a pair of common emitter connected transistors and the output voltage cannot be drawn below the common emitter voltage. The solution to the problem provided by this invention introduces an additional problem with respect to frequency compensation which is solved by a further feature of the invention.

BRIEF SUMMARY OF THE INVENTION

It is therefore an object of this invention to provide an improved high gain amplifier that has even higher gain.

It is a further object of this invention to provide such a high gain amplifier which is capable of virtually rail to rail output.

It is a further object of this invention to provide such a high gain amplifier which is simple to frequency compensate.

The invention results from the realization that an even higher gain, rail to rail amplifier can be achieved by adding a second common emitter output stage which is a gain stage that allows the output to swing widely with respect to its input signal and the further realization that since the second stage is an inverting stage a single capacitive circuit can be interconnected between the output of the second common emitter stage and the input of the first common emitter stage to frequency compensate the whole amplifier.

This invention features a high gain amplifier including a differential amplifier stage having a pair of transistors and first and second input circuits for providing input signals to the pair of transistors. There are transistor means arranged as a differential-to-single-ended converter driven by the differential amplifier stage to provide a single-ended output signal. An intermediate gain stage has an input responsive to the single-ended output signal. And there are bias means for the differential amplifier including circuit means for maintaining the currents through the pair of transistors in constant ratio independently of changes in load at the intermediate gain stage. An inverting gain output stage driven by the intermediate gain stage has an output for driving a load substantially from rail to rail.

In a preferred embodiment the pair of transistors may be connected with common emitters. The input signals may be coupled to the bases of the pair of transistors. The differential-to-single-ended converter may include a first current mirror circuit. The intermediate gain stage may include a first common emitter circuit. The bias means may include a second current mirror circuit; the inverting gain output stage may include a second common emitter circuit. There may be a frequency compensation capacitor circuit connected between the input of the intermediate gain stage and the output of the inverting gain output stage. There may be an operating current circuit for providing an operating bias to the intermediate stage. The output of the intermediate stage may be taken at its emitter. The output of the output stage may be taken at its collector.

The invention also features a high gain amplifier including a transconductance amplifier input stage; a common emitter intermediate gain stage driven by the transconductance amplifier input stage; and a common emitter output gain stage driven by the intermediate gain stage.

In a preferred embodiment the amplifier may include a frequency compensation circuit coupled between the input of the intermediate stage and the output of the output stage for frequency compensating the amplifier for closed loop stability. The frequency compensation circuit may include a single capacitor. The input stage may include a differential amplifier. The differential amplifier may include a pair of transistors. The transistors may be common emitter connected. The input stage may include input circuits connected to the bases of the transistors. The input stage may include a first current mirror. There may be bias means for the differential amplifier. The bias means may include current means for maintaining the currents through the pair of transistors in constant ratio independently of changes in load. The output gain stage may be an inverting stage and it may have its output on its collector. The intermediate stage may have its output at its emitter.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
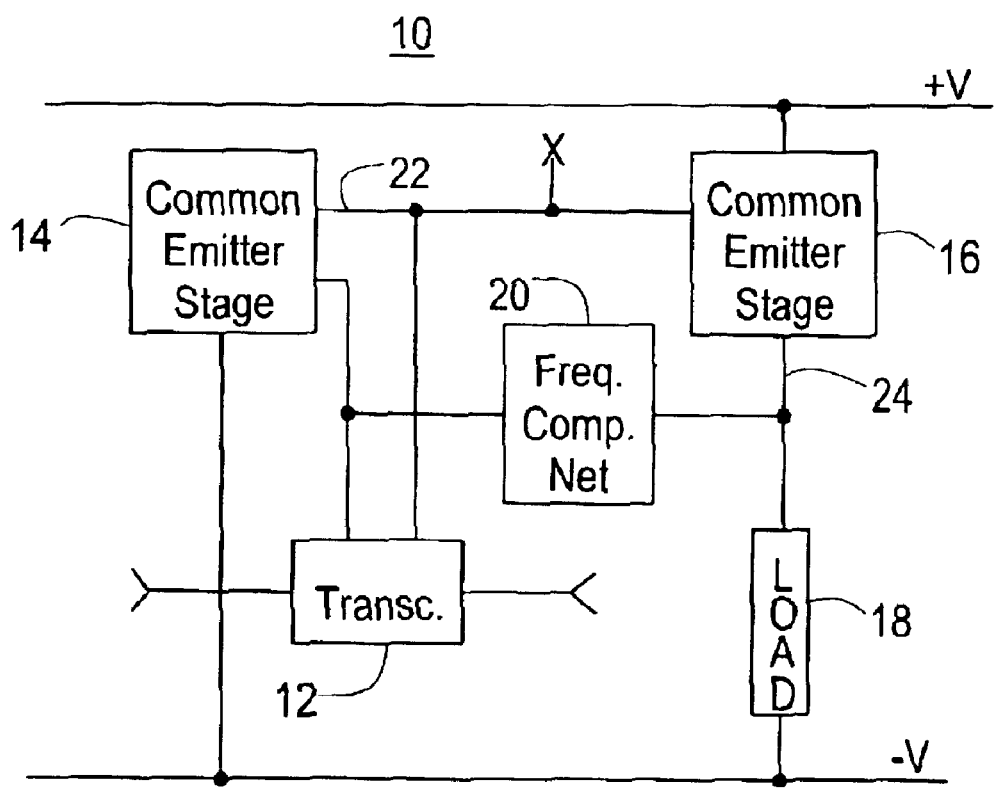
FIG. 1 is a schematic block diagram of a high gain amplifier with frequency compensation according to this invention.

There is shown in FIG. 1 a high gain amplifier 10 according to this invention which includes an input stage transconductance amplifier 12, an intermediate gain stage, common emitter stage 14, and an output stage, common emitter stage 16. Common emitter stage 16 is connected between the positive voltage supply through load 18 to the negative voltage supply. The presence of the second output stage 16 in addition to the original output stage 14 present in the prior art patent enables the use of a single frequency compensation circuit 20 to compensate for the frequency variations in the entire circuit. This is so because common emitter stage 14 actually derives its output from its emitter terminal and common emitter stage 16 is an inverting stage which provides its output at its collector. In this way the frequency compensation circuit 20 has the proper phase for Miller compensation when it is connected as shown between the output of stage 16 and the input of stage 14.

Figure 2:
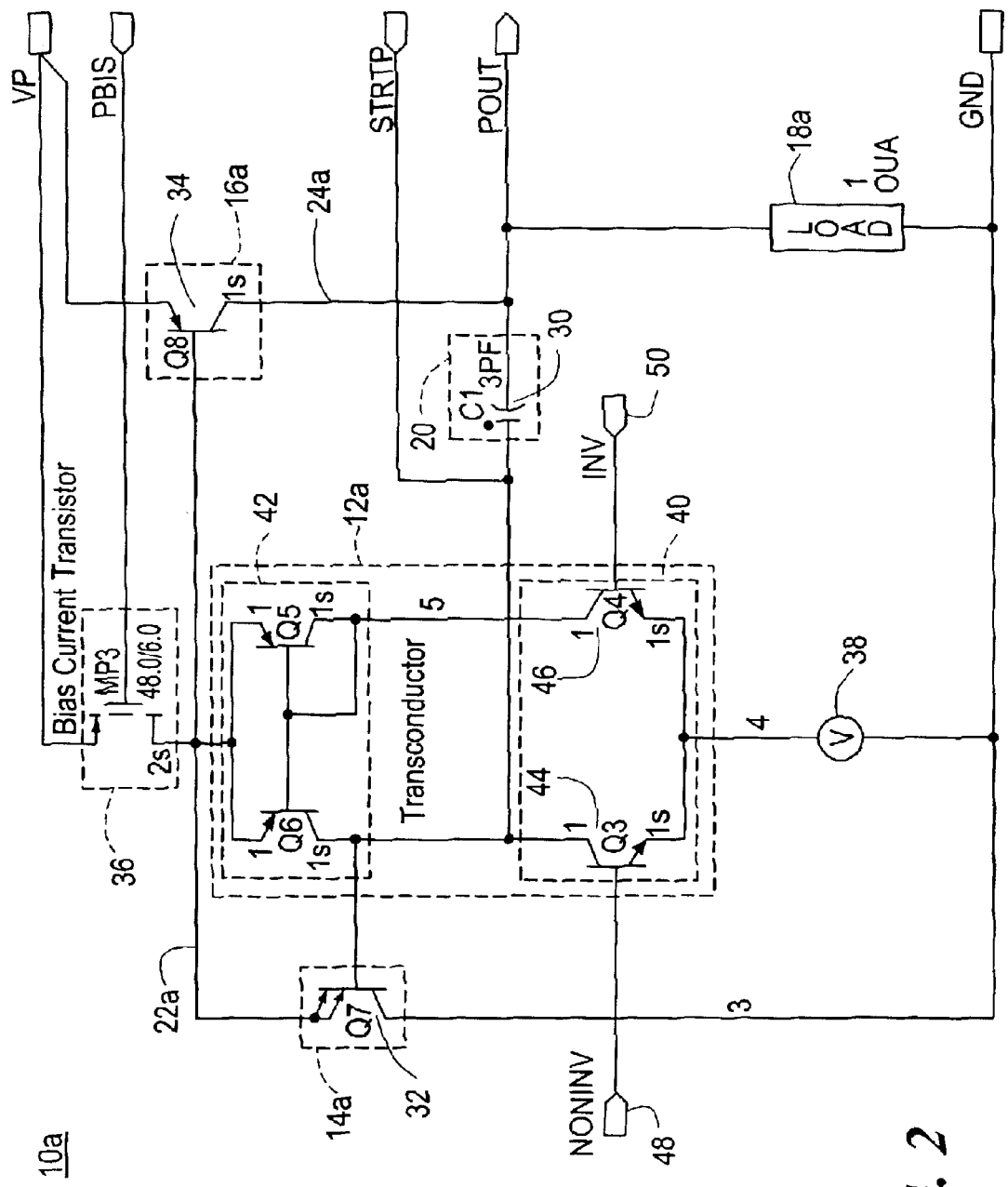
FIG. 2 is a more detailed schematic diagram of the amplifier of FIG. 1.

Circuit 10, FIG. 1, is shown in more detail in FIG. 2, where like parts have been given like numbers accompanied by a lower case a. There it can be seen that the entire frequency compensation circuit includes but a single capacitor 30 of three picofarads. Transconductance intermediate stage 14a is shown as including a pair of parallel connected transistors 32 and output stage 16a includes a transistor 34. A bias current transistor 36 is employed to provide bias current to intermediate stage 14a and a current source 38 provides the tail current to differential amplifier 40 which forms one part of transconductance amplifier 12a. The other part is formed by current mirror 42. Differential amplifier 40 includes a pair of common emitter connected transistors 44 and 46 whose bases are connected to input circuits 48 and 50. In this embodiment the biasing means disclosed in U.S. Pat. No. 4,857,862 has been omitted both for simplicity and to show the more general application of the invention relating to the placement of the frequency compensation circuit 20. The terminal VP connects to the power supply, terminal PBIS connects to a voltage that drives the bias current transistor to provide the selected current, terminal STRTP provides a startup signal to initiate operation of the circuit, and terminal POUT is the output.

Figure 3:
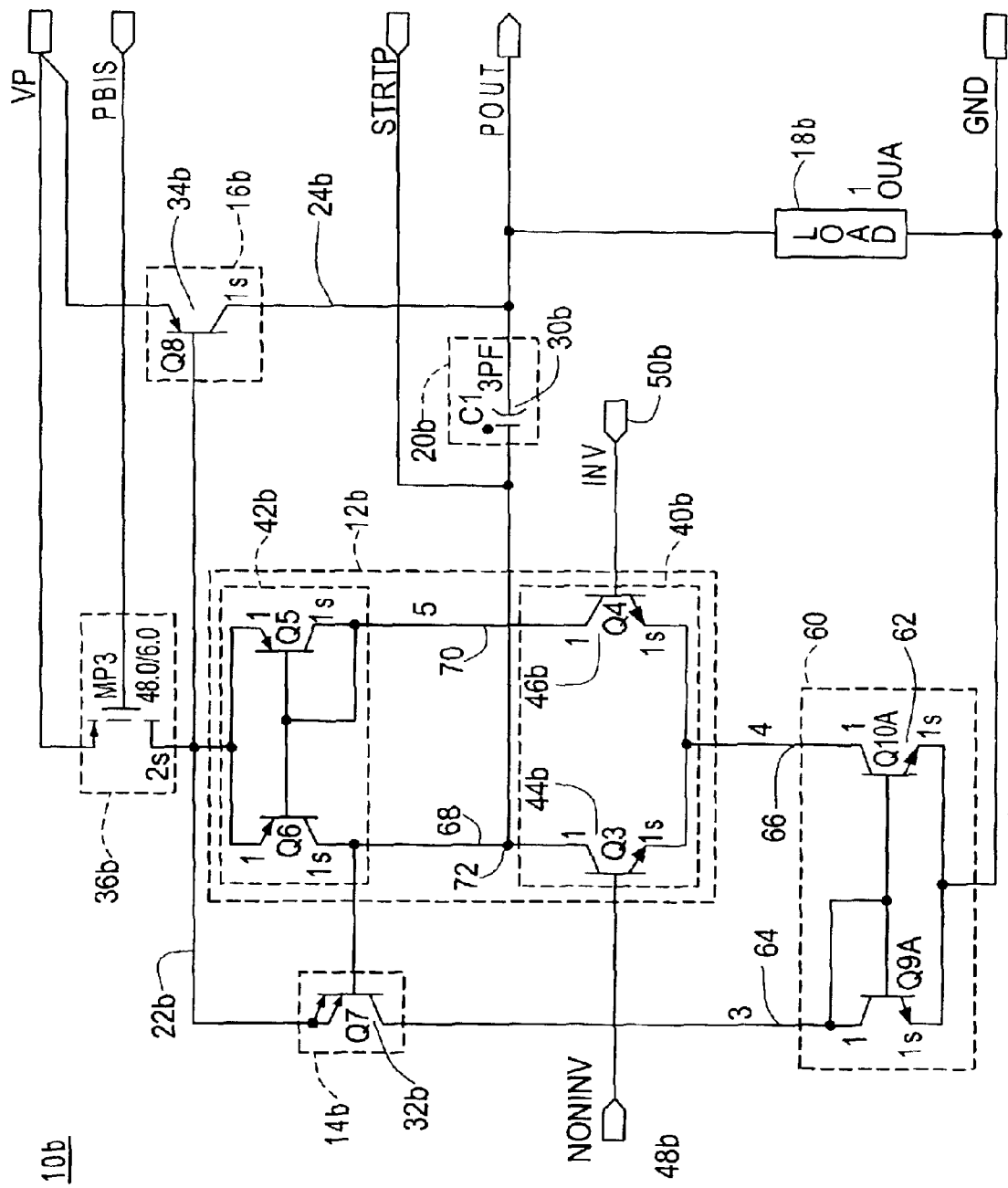
FIG. 3 is a detailed schematic diagram similar to FIG. 2 of another embodiment of the invention which includes the rail to rail feature.

In FIG. 3, the biasing circuit 60 disclosed in U.S. Pat. No. 4,857,862 has been introduced as current mirror 62 which raises the gain and lowers the offset. It also provides equal currents in each of its legs 64, 66. The current in leg 66 is normally equally split between legs 68 and 70 of differential amplifier 40. In normal operation, as explained in U.S. Pat. No. 4,857,862, the external circuit connected at terminals 48 and 50 acts to maintain the fine balance between positive and negative feedback at which differential amplifier 40 operates. A further function and advantage of compensation circuit 20 and capacitor 30 is its damping at point 72 of the operation of the local positive feedback loop through transistors 32 and 44 so that even at frequencies where feedback from the external circuit connected through terminals 48 and 50 is ineffectual, some damping will be afforded to prevent positive feedback runaway. Thus capacitance circuit 30, in addition to providing Miller compensation for stage 16a, also, because of the inverted nature of the output from the emitter of transistor 32, compensates that transistor as well and in addition assists in damping the oscillations in the local positive feedback circuit including transistors 32 and 44.

Figure 4:
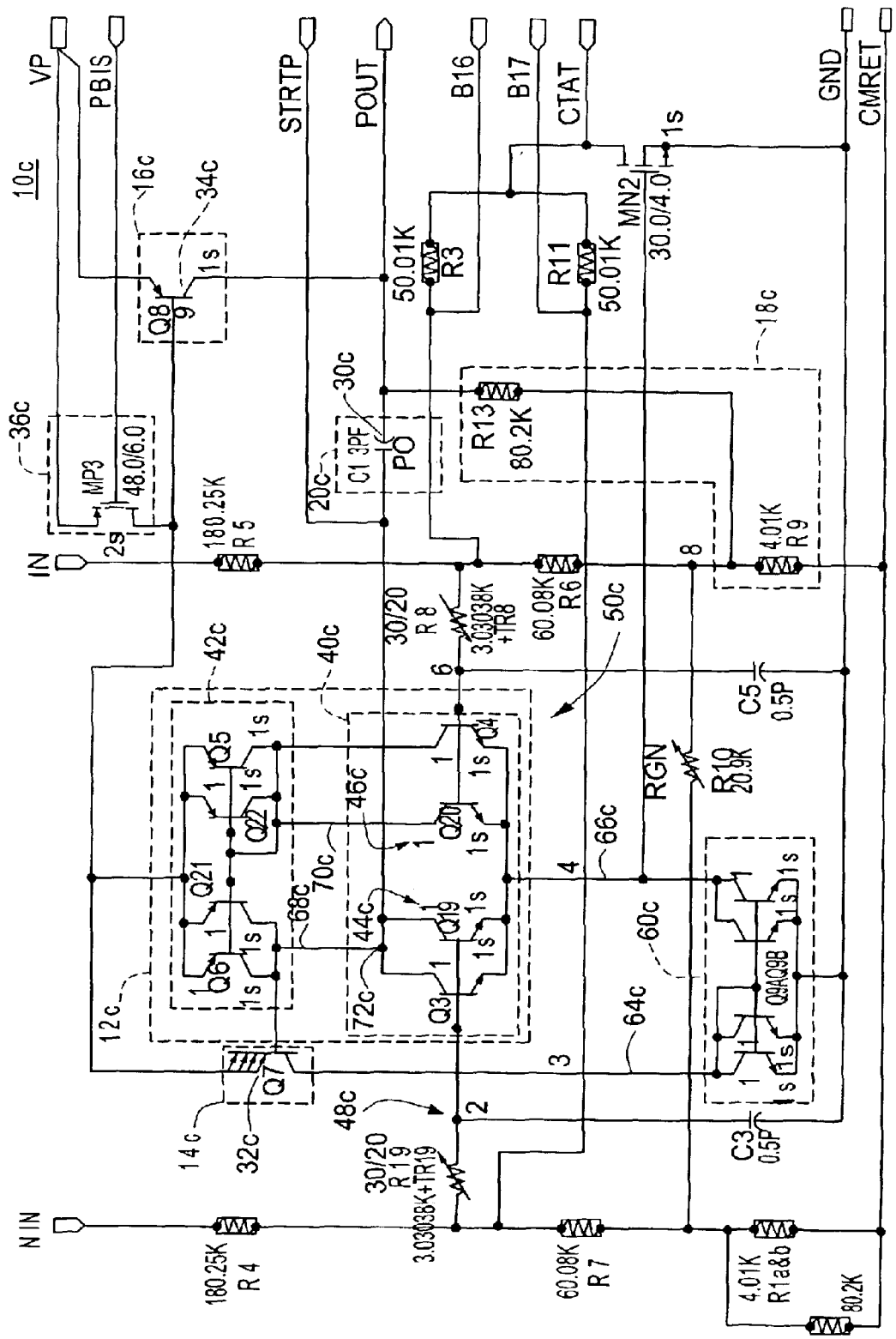
FIG. 4 is a more detailed schematic diagram of one implementation of the circuit of FIG. 3.

A more specific implementation of the invention of FIG. 3 is shown in greater detail in FIG. 4, where like parts have been given like numbers accompanied by a lower case b.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A high gain amplifier comprising:
a differential amplifier stage having a pair of transistors;
first and second input circuits for providing input signals to said pair of transistors;
transistor means arranged as a differential-to-single-ended converter driven by said differential amplifier stage to provide a single-ended output signal;
an intermediate gain stage including a first common emitter circuit, said intermediate gain stage having an output, and an input responsive to said single-ended output signal;
bias means for said differential amplifier, said bias means including circuit means for maintaining the currents through said pair of transistors in constant ratio independently of changes in load at said intermediate gain stage; and
an inverting gain output stage driven by said intermediate gain stage having an output for driving a load substantially from rail to rail.

2. The high gain amplifier of claim 1 in which said pair of transistors are connected with common emitters.

3. The high gain amplifier of claim 1 in which said input signals are coupled to the bases of said pair of transistors.

4. The high gain amplifier of claim 1 in which said differential-to-single-ended converter includes a first current mirror circuit.

5. The high gain amplifier of claim 1 in which said bias means includes a second current mirror circuit.

6. The high gain amplifier of claim 1 in which said inverting gain output stage includes a second common emitter circuit.

7. The high gain amplifier of claim 1 further including a frequency compensation capacitor circuit connected between the input of said intermediate gain stage and the output of said inverting gain output stage.

8. The high gain amplifier of claim 1 further including an operating current circuit for providing an operating bias to said intermediate stage.

9. The high gain amplifier of claim 1 in which the output of said intermediate gain stage is at its emitter.

10. The high gain amplifier of claim 6 in which the output of said output stage is at its collector.

11. A high gain amplifier comprising:
a differential amplifier stage having a pair of transistors;
first and second input circuits for providing input signals to said pair of transistors;
transistor means arranged as a differential-to-single-ended converter driven by said differential amplifier stage to provide a single-ended output signal;
an intermediate gain stage having an output, and an input responsive to said single-ended output signal, said intermediate gain stage including a transistor having an emitter directly connected by at least one passive element to the emitters of the differential-to-single-ended converter,
bias means for said differential amplifier, said bias means including circuit means for maintaining the currents through said pair of transistors in constant ratio independently of changes in load at said intermediate gain stage; and
an inverting gain output stage driven by said intermediate gain stage having an output for driving a load substantially from rail to rail.

12. The high gain amplifier of claim 11 in which said pair of transistors are connected with common emitters.

13. The high gain amplifier of claim 11 in which said input signals are coupled to the bases of said pair of transistors.

14. The high gain amplifier of claim 11 in which said differential-to-single-ended converter includes a first current mirror circuit.

15. The high gain amplifier of claim 11 in which said bias means includes a second current mirror circuit.

16. The high gain amplifier of claim 11 in which said inverting gain output stage includes a common emitter circuit.

17. The high gain amplifier of claim 11 further including a frequency compensation capacitor circuit connected between the input of said intermediate gain stage and the output of said inverting gain output stage.

18. The high gain amplifier of claim 11 further including an operating current circuit for providing an operating bias to said intermediate stage.

19. The high gain amplifier of claim 11 in which the output of said intermediate gain stage is at its emitter.

20. The high gain amplifier of claim 16 in which the output of said output stage is at its collector.

21. A high gain amplifier comprising:

a differential amplifier stage having a pair of transistors;

first and second input circuits for providing input signals to said pair of transistors;

transistor means arranged as a differential-to-single-ended converter driven by said differential amplifier stage to provide a single-ended output signal;

an intermediate gain stage having an output, and an input responsive to said single-ended output signal, said intermediate gain stage including a transistor having an emitter directly connected by at least one conductor to the emitters of the differential-to-single-ended converter;

bias means for said differential amplifier, said bias means including circuit means for maintaining the currents through said pair of transistors in constant ratio independently of changes in load at said intermediate gain stage; and an inverting gain output stage driven by said intermediate gain stage having an output for driving a load substantially from rail to rail.

22. A high gain amplifier comprising:

a differential amplifier stage having a pair of transistors;

first and second input circuits for providing input signals to said pair of transistors;

transistor means arranged as a differential-to-single-ended converter driven by said differential amplifier stage to provide a single-ended output signal;

an intermediate gain stage having an output, and an input responsive to said single-ended output signal;

bias means for said differential amplifier, said bias means including a current mirror circuit for maintaining the currents through said pair of transistors in constant ratio independently of changes in load at said intermediate gain stage; and an inverting gain output stage driven by said intermediate gain stage having an output for driving a load substantially from rail to rail.

23. A high gain amplifier comprising:

a differential amplifier stage having a pair of transistors;

first and second input circuits for providing input signals to said pair of transistors;

transistor means arranged as a differential-to-single-ended converter driven by said differential amplifier stage to provide a single-ended output signal;

an intermediate gain stage configured to have voltage gain greater than unity, an output, and an input responsive to said single-ended output signal;

bias means for said differential amplifier, said bias means including circuit means for maintaining the currents through said pair of transistors in constant ratio independently of changes in load at said intermediate gain stage; and an inverting gain output stage driven by said intermediate gain stage having an output for driving a load substantially from rail to rail.

24. A high gain amplifier comprising:

a transconductance amplifier input stage including a differential amplifier, said differential amplifier including a pair of transistors;

input circuits connected to the bases of the transistors;

a common emitter intermediate gain stage driven by said transconductance amplifier input stage;

a common emitter output gain stage driven by said intermediate gain stage; and bias means for said differential amplifier, said bias means including current means for maintaining the currents through said pair of transistors in a constant ratio independently of changes in load.

* * * * *